(12) United States Patent
Park et al.

(10) Patent No.: US 9,793,000 B2
(45) Date of Patent: Oct. 17, 2017

(54) NONVOLATILE MEMORIES HAVING DATA INPUT/OUTPUT SWITCHES FOR REDUCING PARASITIC CAPACITANCE OF BUS CHANNEL

(71) Applicant: Samsung Electronics Co., Ltd., Suwon-si, Gyeonggi-do (KR)

(72) Inventors: Jiwoon Park, Suwon-si (KR); Junghee Cho, Seoul (KR); Su-Jin Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/736,683

(22) Filed: Jun. 11, 2015

(65) Prior Publication Data
US 2015/0380090 A1    Dec. 31, 2015

(30) Foreign Application Priority Data

Jun. 26, 2014    (KR) .................. 10-2014-0079064

(51) Int. Cl.
  *G11C 16/06*    (2006.01)
  *G11C 16/34*    (2006.01)
  *G11C 16/10*    (2006.01)

(52) U.S. Cl.
  CPC ............ *G11C 16/349* (2013.01); *G11C 16/10* (2013.01)

(58) Field of Classification Search
  CPC ..... G11C 16/3495; G11C 16/349; G11C 7/02; G11C 7/10; G11C 7/1057; G11C 7/1084; G11C 5/06; G11C 5/04; G11C 5/02; G11C 2207/104; G11C 2207/105
  See application file for complete search history.

(56) References Cited

U.S. PATENT DOCUMENTS

| 6,069,495 | A | 5/2000 | Ciccone et al. | |
| 6,319,773 | B1 | 11/2001 | Noble et al. | |
| 6,349,051 | B1 * | 2/2002 | Klein | G06F 13/1684 |
| | | | | 365/51 |
| 6,498,739 | B2 | 12/2002 | Cloud et al. | |
| 6,504,783 | B2 | 1/2003 | Jo | |
| 6,914,280 | B2 | 7/2005 | Asano et al. | |
| 7,078,824 | B2 | 7/2006 | Shimanuki et al. | |
| 7,279,994 | B2 | 10/2007 | Takagi | |
| 8,135,890 | B2 | 3/2012 | Woo et al. | |
| 8,325,551 | B2 | 12/2012 | Choi | |
| 8,436,664 | B2 | 5/2013 | Wang et al. | |
| 8,437,177 | B2 | 5/2013 | Katoh | |
| 8,681,546 | B2 * | 3/2014 | Fai | G11C 8/10 |
| | | | | 365/185.05 |
| 8,996,822 | B2 * | 3/2015 | Abdulla | G06F 13/16 |
| | | | | 711/105 |

(Continued)

*Primary Examiner* — Andrew Q Tran
(74) *Attorney, Agent, or Firm* — Ward and Smith, P.A.

(57) ABSTRACT

A nonvolatile memory includes a memory cell array including a plurality of memory cells, a pad configured to be connected to a data input/output line, and an input/output circuit configured to receive data to be programmed in the memory cell array and to transmit data read from the memory cell array. The nonvolatile memory further includes a switch configured to couple and decouple the pad and the input/output circuit responsive to a switch control signal and a control circuit configured to generate the switch control signal responsive to a chip enable signal. Data storage devices and methods using such nonvolatile memories are also described.

9 Claims, 14 Drawing Sheets

(56) References Cited

U.S. PATENT DOCUMENTS

2004/0109342 A1 6/2004 Fujino
2012/0215958 A1 8/2012 Fai et al.
2013/0031315 A1 1/2013 Abdulla et al.

* cited by examiner

NONVOLATILE MEMORIES HAVING DATA INPUT/OUTPUT SWITCHES FOR REDUCING PARASITIC CAPACITANCE OF BUS CHANNEL

CROSS-REFERENCE TO RELATED APPLICATIONS

A claim for priority under 35 U.S.C. §119 is made to Korean Patent Application No. 10-2014-0079064 filed Jun. 26, 2014, in the Korean Intellectual Property Office, the entire contents of which are hereby incorporated by reference.

BACKGROUND

The inventive subject matter relates to memory devices and methods of operating the same and, more particularly, to memory devices using multiple memories connected to a common data input/output line and methods of operating the same.

Semiconductor memory devices may be classified as volatile semiconductor memory devices or nonvolatile semiconductor memory devices. Nonvolatile semiconductor memory devices may retain data stored therein when powered off. Data storage in nonvolatile semiconductor memory devices may be permanent or reprogrammable, depending upon the fabrication technology used.

A flash memory device is one type of nonvolatile memory device. Flash memory devices are widely used as voice and image data storage media in information processing devices, such as solid state drives, computers, handheld telephones, smart phones, digital cameras, camcorders, voice recorders, MP3 players, PDAs, handheld PCs, game consoles, facsimile machines, scanners, and printers. For the past several years, techniques have been developed to provide high-capacity, high-speed input/output and low-power nonvolatile memory devices in solid state drives or mobile devices (e.g., smart phones).

High-capacity and high-speed input/output solutions may be achieved by means of multi-stack chip packages wherein a plurality of nonvolatile memories are connected through the same channel. Reliability of such a data storage system may be reduced due to resistance and parasitic capacitance of unselected nonvolatile memories when performing a read, write or copy-back operation on a selected device. The parasitic capacitance may be reduced by increasing a driving force, which may cause overshoot and undershoot problems.

Thus, a measured capacitance value of a channel needs to be adjusted to correspond to a reference capacitance value defined in the specification to improve signal integrity.

SUMMARY

Some embodiments of the inventive subject matter provide a nonvolatile memory including a memory cell array including a plurality of memory cells, a pad configured to be connected to a data input/output line, and an input/output circuit configured to receive data to be programmed in the memory cell array and to transmit data read from the memory cell array. The nonvolatile memory further includes a switch configured to couple and decouple the pad and the input/output circuit responsive to a switch control signal and a control circuit configured to generate the switch control signal responsive to a chip enable signal. In some embodiments, the switch control signal may be configured to close the switch when the chip enable signal indicates selection of the memory and to open the switch when the chip enable indicates unselection of the memory.

In further embodiments, the nonvolatile memory may include a voltage generator configured to generate a program voltage for programming the memory cell array and a switching voltage for driving the switch. The switch may include a transmission gate including at least one NMOS transistor and at least one PMOS transistor connected in parallel and driven by the switching voltage. The input/output circuit may include a driver connected to the switch and configured to drive data to be transmitted to the pad and a receiver connected to the switch and configured to receive data from the pad. The driver may include at least two NMOS transistors connected in parallel coupled in series with at least two PMOS transistors connected in parallel.

In some embodiments, the voltage generator may be configured to vary the switching voltage responsive to deterioration of the switch. In further embodiments, the voltage generator may be configured to vary the switching voltage based on a measurement of a use time and/or a measurement of a number of program/erase cycles.

Further embodiments provide methods of operating a data storage device which includes a plurality of nonvolatile memories coupled in common to a data input/output line, respective ones of the nonvolatile memories including a respective input/output circuit configured to be coupled and decoupled to and from the data input/output line by respective switches. The methods include turning on the switch of a selected nonvolatile memory of the plurality of nonvolatile memories and turning off the switch of at least one unselected nonvolatile memory of the plurality of nonvolatile memories while the switch of the selected nonvolatile memory is on.

In some embodiments, turning off the switch of at least one unselected nonvolatile memory of the plurality of nonvolatile memories while the switch of the selected nonvolatile memory is on may include turning off the switch of the at least one unselected nonvolatile memory responsive to a chip enable signal.

In some embodiments, turning off the switch of at least one unselected nonvolatile memory of the plurality of nonvolatile memories while the switch of the selected nonvolatile memory is on may be preceded by measuring a capacitance value at the data input/output line. Turning off the switch of at least one unselected nonvolatile memory of the plurality of nonvolatile memories while the switch of the selected nonvolatile memory is on may include turning off the switch of the at least one unselected nonvolatile memory based on the measured capacitance. Turning off the switch of the at least one unselected nonvolatile memory based on the measured capacitance may include comparing the measured capacitance to a reference capacitance and turning off the switch of the at least one unselected nonvolatile memory based on the comparison.

According to further embodiments, the methods may further include varying a switching voltage applied to at least one of the switches responsive to deterioration of the at least one of the switches. In some embodiments, the methods may further include varying a switching voltage applied to at least one of the switches based on a measurement of a use time and/or a measurement of a number of program/erase cycles.

Still further embodiments provide a data storage device including a plurality of nonvolatile memories connected to a memory controller by a common channel, each nonvolatile memory including an input/output circuit configured to transmit data to and receive data from a data input/output line of the common channel and a plurality of switches, respective ones of which are configured to couple and decouple the data input/output line and the input/output circuits of the nonvolatile memories. The data storage device further includes a control circuit configured to control the switches.

In some embodiments, the control circuit may be configured to control at least one of the switches responsive to a chip enable signal.

In some embodiments, respective ones of the switches may be included in respective ones of the nonvolatile memories and the control circuit may include respective control circuits included in respective ones of the nonvolatile memories and configured to control the respective switches.

In some embodiments, the control circuit may be configured to adjust a number of switches of unselected ones of the nonvolatile memories turned on based on a comparison of a measured capacitance at the data input/output line to a reference capacitance value.

In some embodiments, the control circuit may be configured to vary a switching voltage applied to at least one of the switches responsive to deterioration of the at least one of the switches.

In further embodiments, the control circuit may be configured to vary a switching voltage applied to at least one of the switches based on a measurement of a use time and/or a measurement of a number of program/erase cycles.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
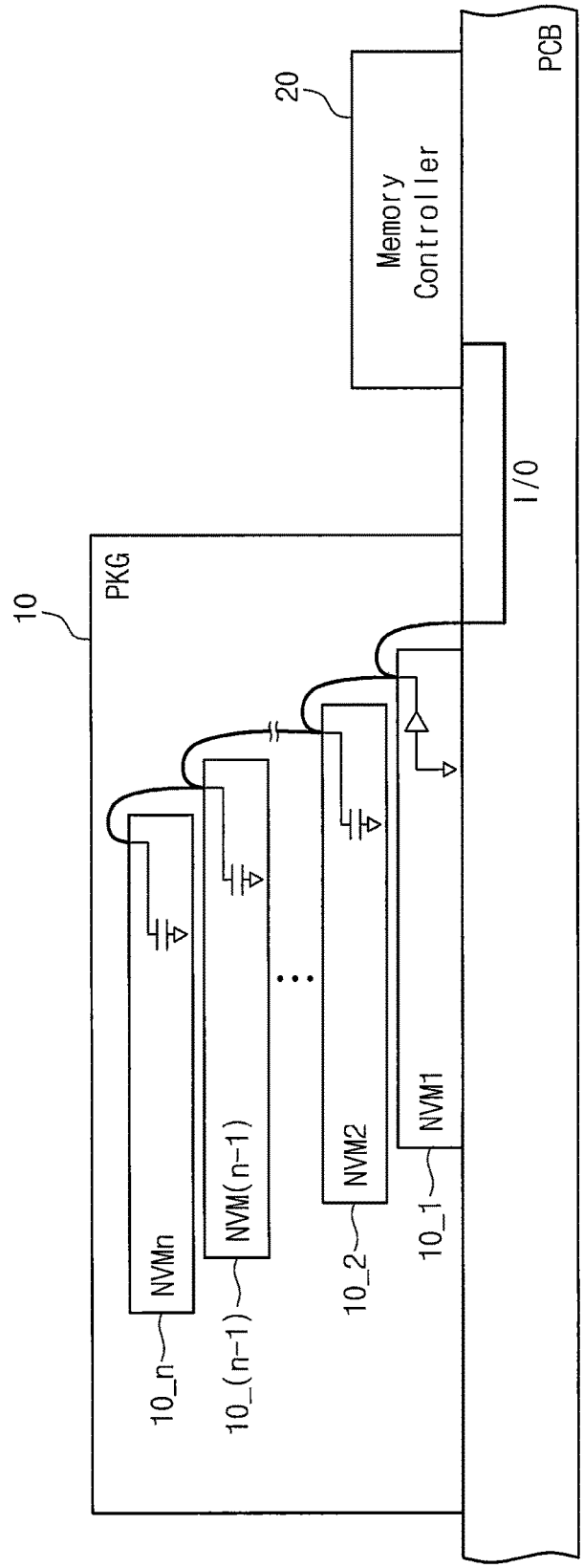
FIG. 1 is a cross-sectional view of a conventional data storage device.

Embodiments will be described in detail with reference to the accompanying drawings. The inventive subject matter, however, may be embodied in various different forms, and should not be construed as being limited only to the illustrated embodiments. Rather, these embodiments are provided as examples so that this disclosure will be thorough and complete, and will fully convey the concept of the inventive subject matter to those skilled in the art. Accordingly, known processes, elements, and techniques are not described with respect to some of the embodiments of the inventive subject matter. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive subject matter.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a cross-sectional view of a conventional data storage device. A data storage device contains a package 10 including a plurality of nonvolatile memories 10_1 through 10_n and a memory controller 20 provided on a printed circuit board PCB. Only illustrated are the memory controller 20 and the package 10 including the nonvolatile memories 10_1 through 10_n, but the data storage device may further include other components (e.g., a power management device).

The package 10 contains the nonvolatile memories 10_1 through 10_n. If the nonvolatile memories 10_1 through 10_n are contained in the package 10 in the form of multi-stack chip, the stacked nonvolatile memories 10_1 through 10_n are connected to the memory controller 20 through the same channel. When a nonvolatile memory 10-1 from which data is to be read or to which data is to be written is selected when a command associated with a read or write operation is received from a host (not shown), capacitance of the channel may include parasitic capacitance of unselected nonvolatile memories 10_2 through 10_n that are not associated with a read or write operation or a copy-back operation, etc.

In terms of signal integrity, the parasitic capacitance influences data transmission through the channel. It is assumed that write data is transmitted to a nonvolatile memory. When a reflection coefficient between the nonvolatile memories 10_1 through 10_n and the channel is '0', data to be transmitted to a nonvolatile memory may be transferred to the nonvolatile memory without reflection. The reflection coefficient is expressed by the following equation:

$$\Gamma = \frac{Zr - Zo}{Zr + Zo} \quad (1)$$

In equation (1), 'Zr' indicates impedance of the nonvolatile memories 10_1 through 10_n and 'Zo' indicates self-impedance of the channel. Theoretically, reflection may not occur when a value of impedance of the nonvolatile memories 10_1 through 10_n is equal to that of self-impedance of the channel. Parasitic capacitance of nonvolatile memories connected to the same channel increases in proportion to an increase in the number of nonvolatile memories connected to the same channel. In this case, probability that signals transmitted to the nonvolatile memories 10_1 through 10_n from the memory controller 20 are reflected may become higher. Since signals are distorted due to reflection or impedance mismatch, it is desirable to make a measured reactance value of a channel have a predetermined value. Practically, capacitance is mainly associated with the number of nonvolatile memories, and inductance is largely associated with a physical length of the channel.

Figure 2:
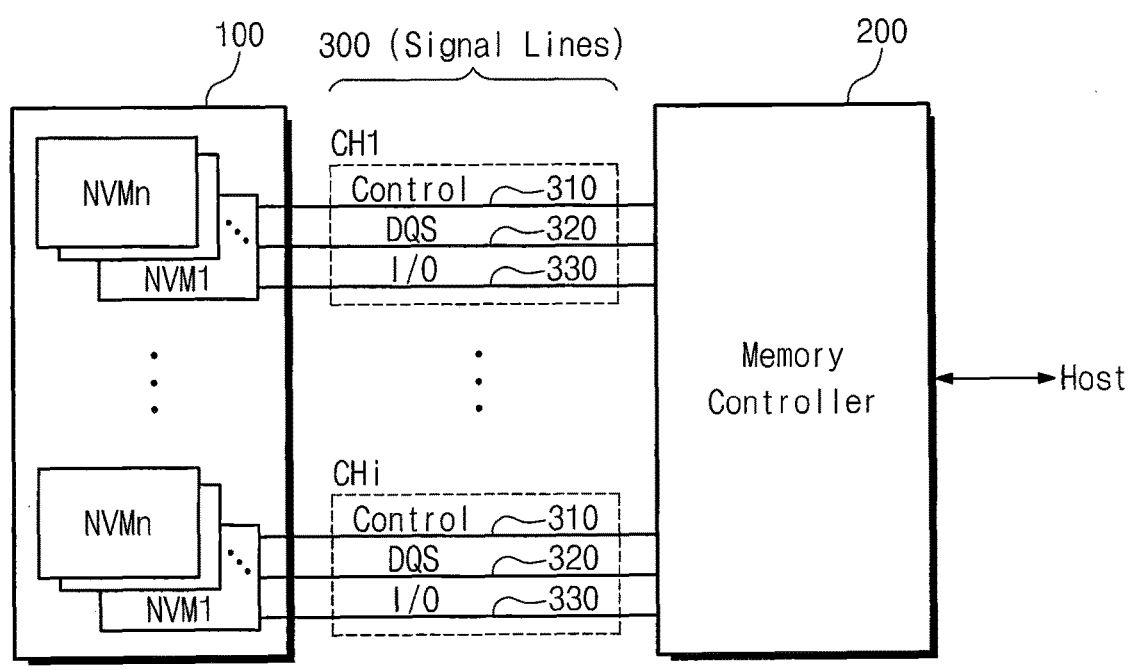
FIG. 2 is a block diagram schematically illustrating a data storage device according to some embodiments of the inventive subject matter.

FIG. 2 is a block diagram schematically illustrating a data storage device according to some embodiments of the inventive subject matter. Referring to FIG. 2, a data storage device contains nonvolatile memories 100, a memory controller 200, and signal lines 300 connecting the nonvolatile memories 100 and the memory controller 200.

The nonvolatile memories 100 may be arranged in the form of a multi-stack chip. A set of nonvolatile memories of a multi-stack chip may be connected to the memory controller 200 through the same channel (e.g., first channel CH1). If the number of channels is 'i', 'i' sets of nonvolatile memories are provided.

The memory controller 200 reads or writes data from or at the nonvolatile memories 100 in response to a read or write request from the host. Exchanging data with the nonvolatile memories 100, the memory controller 200 uses a data strobe signal DQS. The data strobe signal DQS is used to provide a reference point in time when a logical value of input/output data exchanged between the nonvolatile memories 100 and the memory controller 200 is decided. In some embodiments, the memory controller 200 may not use the data strobe signal DQS.

The signal lines 300 provide a plurality of channels. Each channel contains control signal lines 310, a DQS line 320, and data input/output lines 330. In other some embodiments, each channel may not include the DQS line. Control signals (e.g., /CE, /RE, /WE, etc.) provided from the memory controller 200 to control the nonvolatile memories 100 are transferred through the control signal lines 310. A data strobe signal DQS is transferred through the DQS line 320. Input/output data I/O DATA is transmitted through the data input/output lines 330.

In a data storage device according to some embodiments of the inventive subject matter, each nonvolatile memory contains a data input/output switch. The data storage device may turn the data input/output switch of an unselected nonvolatile memory (i.e., a memory that is not associated with a particular read, write or copy-back operation, etc) on or off. Adjustment is made under a control of the data storage device such that a measured capacitance value of a channel satisfies a predetermined criterion, for example, such that the measured capacitance value substantially equals a reference value. For example, when the measured capacitance value of the channel exceeds the reference value, data input/output switches of unselected nonvolatile memories may be turned off such that the measured capacitance value of the channel substantially equals the reference value. When the measured capacitance value of the channel is smaller than the reference value, data input/output switches of unselected nonvolatile memories may be turned on such that the measured capacitance value of the channel substantially equals the reference value.

Figure 3:
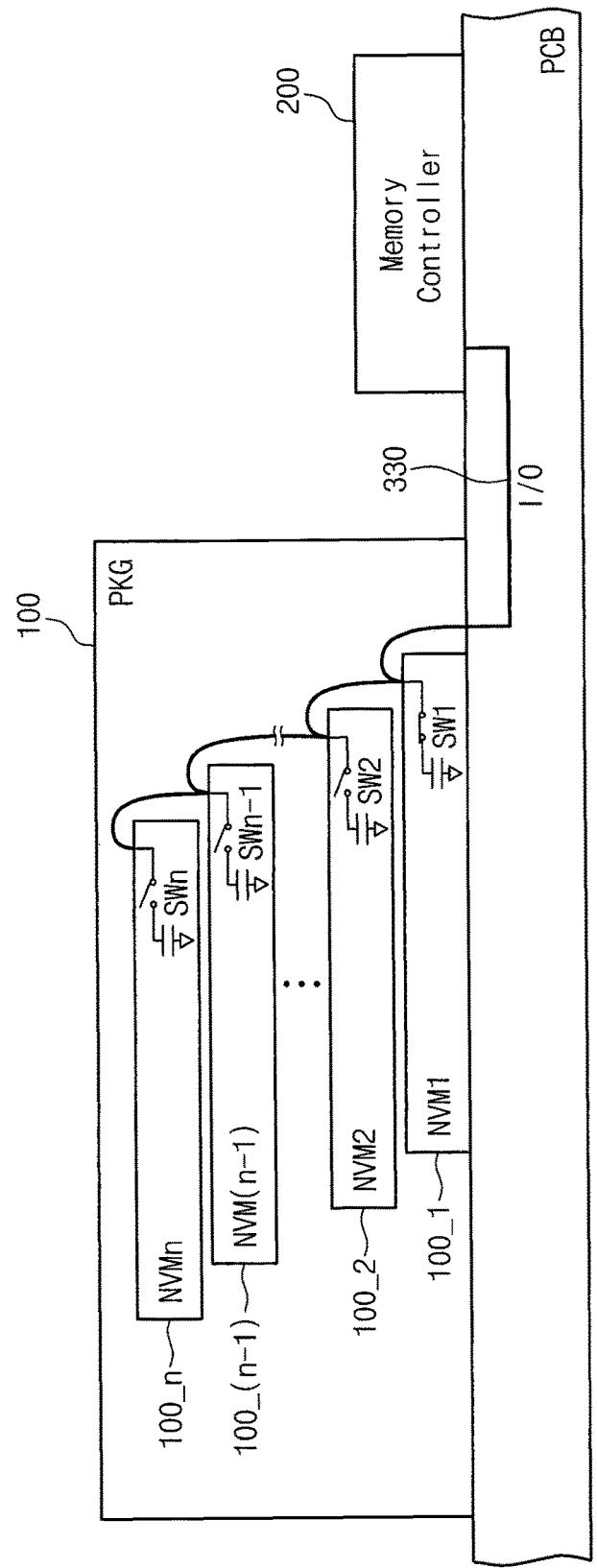
FIG. 3 is a cross-sectional view of a data storage device according to some embodiments of the inventive subject matter.

FIG. 3 is a cross-sectional view of a data storage device according to some embodiments of the inventive subject matter. In FIG. 3, some embodiments of the inventive subject matter are exemplified as a data input/output line 330 of a first channel is cut.

A data storage device according to some embodiments of the inventive subject matter includes a plurality of nonvolatile memories 100_1 through 100_n and a memory controller 200 provided on a printed circuit board PCB. The nonvolatile memories 100_1 through 100_n contain data input/output switches SW1 through SWn, respectively. In FIG. 3, some embodiments of the inventive subject matter is exemplified as the data input/output switches SW1 through SWn are respectively contained in the nonvolatile memories 100_1 through 100_n. However, the inventive subject matter is not limited thereto. For example, the data input/output switches SW1 through SWn may be located external to the nonvolatile memories 100_1 through 100_n. The data storage device turns on a data input/output switch of a selected nonvolatile memory (e.g., 100_1) associated with a read or write operation or a copy-back operation, etc. The data storage device turns on or off data input/output switches of unselected nonvolatile memories (e.g., 100_2 through 100_n) not associated with a read or write operation or a copy-back operation, etc.

The number of nonvolatile memories of which the data input/output switches are turned on or off may be adjusted to substantially equal a prescribed capacitance value. For example, when a measured capacitance value of a channel exceeds a reference value, the data storage device may turn off data input/output switches of unselected nonvolatile memories to substantially equal the reference value. When the measured capacitance value of the channel is smaller than the reference value, the data storage device may turn on data input/output switches of unselected nonvolatile memories to substantially equal the reference value.

The data input/output switches may increase parasitic capacitance of the nonvolatile memories. However, by selectively turning on the data input/output switches of unselected nonvolatile memories such that the measured capacitance value of the channel substantially equals the reference value, it is possible to overcome an increase in capacitance due to the added data input/output switch. Thus, signal integrity and reliability may be increased.

Figure 4:
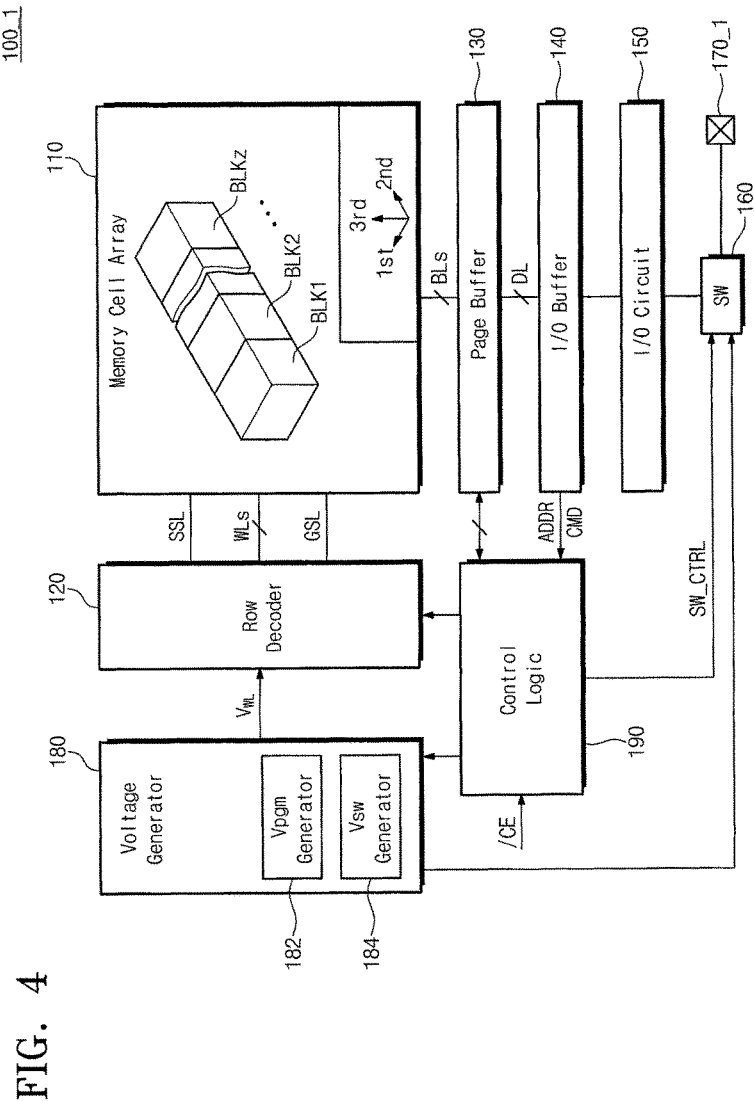
FIG. 4 is a block diagram schematically illustrating a nonvolatile memory according to some embodiments of the inventive subject matter.

FIG. 4 is a block diagram schematically illustrating a nonvolatile memory according to some embodiments of the inventive subject matter. Referring to FIG. 4, a nonvolatile memory 100_1 contains a memory cell array 110, a row decoder 120, a page buffer 130, an input/output buffer 140, an input/output circuit 150, a data input/output switch 160, a pad 170_1, a voltage generator 180, and control logic 190.

The memory cell array 110 includes a plurality of memory blocks BLK1 to BLKz (z being an integer of 2 or more), each of which has a three-dimensional structure (or, a vertical structure). In a memory block with a two-dimensional structure (or, a horizontal structure), memory cells are formed in a direction parallel with a substrate. In a memory block with a three-dimensional structure, memory cells are formed in a direction perpendicular to the substrate.

The row decoder 120 is connected to the memory cell array 110 through selection lines SSL and GSL and word lines. The row decoder 120 receives a word line voltage $V_{WL}$ from the voltage generator 180 and is controlled by the control logic 190. The row decoder 120 selects a word line at a program or read operation. Provided to the selected word line is a program voltage, a verification voltage, or a read voltage.

The page buffer circuit 130 is connected to the memory cell array 110 through bit lines. The page buffer circuit 130 is formed of a plurality of page buffers (not shown). One page buffer is connected to one bit line or to two or more bit lines. The page buffer circuit 130 temporarily stores data to be programmed at a selected page or data read out from the selected page.

The input/output buffer 140 is connected to the page buffer circuit 130 through data lines DL and to the input/output circuit 150. The input/output buffer 140 receives program data from the input/output circuit at a program operation. During a read operation, the input/output buffer 140 provides the input/output circuit 150 with read data. The input/output buffer 140 provides the control logic 190 with an address and a command during a program or read operation.

The input/output circuit 150 is connected to the input/output buffer 140 and the data input/output switch 160. The input/output circuit 150 corrects skew of a signal provided to the nonvolatile memory 100_1 during a program or read operation. The input/output circuit 150 drives data to be provided to a memory controller 200 (refer to FIG. 2) during a read operation.

The data input/output switch 160 is connected to the input/output circuit 150 and to the pad 170_1 connected to the memory controller 200. The data input/output switch 160 operates in response to power provided from the voltage generator 180. For example, the data input/output switch 160 may be formed of at least one MOS transistor or a transmission gate where an NMOS transistor and a PMOS transistor are connected in parallel.

The nonvolatile memory 100_1 includes the data input/output switch 160. The data input/output switch 160 is connected to a data input/output line 330 (refer to FIG. 2) through which input/output data I/O DATA passes. A capacitance value of a channel increases in proportion to an increase in the number of nonvolatile memories connected to the channel. Thus, the need to adjust the measured capacitance value of the channel is increased more and more.

In some embodiments, when a plurality of nonvolatile memories are connected to a memory controller through the same channel, a measured channel-capacitance value may be adjusted by turning on or off a data input/output switch of an unselected nonvolatile memory. For example, when the measured channel-capacitance value exceeds a reference value, data input/output switches of unselected nonvolatile memories may be turned off to substantially equal the reference value. When the measured channel-capacitance value is smaller than the reference value, data input/output switches of unselected nonvolatile memories may be turned on to substantially equal the reference value.

In some embodiments, a level of a voltage for turning on the data input/output switch 160 may be adjusted to adjust a channel resistance value measured. For example, as the number of transistors constituting the data input/output switch 160 decreases, a level of the voltage for turning on the data input/output switch 160 becomes greater. If a number of transistors are connected in parallel with the data input/output switch 160, a level of the voltage for turning on the data input/output switch 160 becomes smaller. The reason is that self-resistance of the data input/output switch 160 decreases by connecting transistors in parallel.

The pad 170_1 is connected to the memory controller 200 through a data input/output line 330 (refer to FIG. 2).

The voltage generator 180 receives power from a power supply circuit (not shown) and generates the word line voltage $V_{WL}$ needed to write or read data. The word line voltage $V_{WL}$ is provided to the row decoder 120.

The voltage generator 180 contains a program voltage generator 182 and a switching voltage generator 184. Although not shown in FIG. 4, the voltage generator 180 may produce a pass voltage for a program operation, a read voltage for a read operation, an erase voltage for an erase operation, and so on.

The program voltage generator 182 generates a program voltage for programming the memory cell array 110. The switching voltage generator 184 produces a switching voltage Vsw for turning on the data input/output switch 160. The program voltage Vpgm may be applied to the data input/output switch 160 to turn on the data input/output switch 160. In some embodiments, a switching voltage Vsw lower than the program voltage Vpgm may be applied to the data input/output switch 160. The switching voltage Vsw may be applied to the data input/output switch 160 when a resistance value of a data input/output switch is relatively small because a number of transistors are connected in parallel to the data input/output switch. In addition, the switching voltage Vsw may be adjusted based on the level of deterioration of transistors included in the data input/output switch 160. The level of deterioration of transistors included in the data input/output switch 160 may be determined based on measurement of a use time (e.g., by an end user of the device) or a measurement of a measurement of a number of program/erase cycles generated by the control logic 190.

The control logic 190 controls a program, a read, or an erase operation of the nonvolatile memory 100_1 in response to a command and an address from the memory controller 200. The nonvolatile memory 100_1 is activated when a chip enable signal /CE is applied to the control logic 190 from the memory controller 200.

The control logic 190 adjusts a level of a voltage to be provided to the data input/output switch 160 to turn on the data input/output switch 160. For example, the control logic 190 may turn on the data input/output switch 160 while the chip enable signal /CE for activating the nonvolatile memory 100_1 is activated. In some embodiments, a period in which the data input/output switch 160 is turned on may be somewhat delayed compared with a period in which the chip enable signal /CE is activated. The control logic 190 makes the chip enable signal /CE from the memory controller 200 bypassed to the data input/output switch 160. The control logic 190 responds to the chip enable signal /CE to generate a switch control signal SE_CTRL for controlling the data input/output switch 160.

The program voltage Vpgm may be used to turn on the data input/output switch 160. In some embodiments, a switching voltage Vsw different from the program voltage Vpgm may be used to turn on the data input/output switch 160. When a resistance value of a data input/output switch is relatively small due to a number of transistors connected in parallel to the data input/output switch, the switching voltage Vsw may be applied to the data input/output switch 160 under the control of the control logic 190. The control logic 190 may adjust a level of the switching voltage Vsw based on the degree of deterioration of transistors contained in the data input/output switch 160. The level of deterioration of transistors included in the data input/output switch 160 may be determined based on a measurement of a use time and/or a measurement of a number of program/erase cycles.

Figure 5:
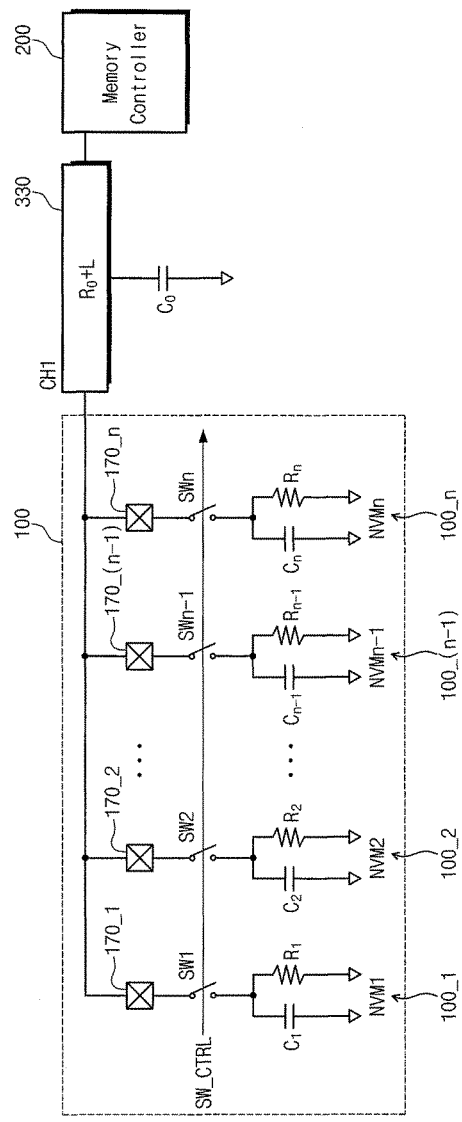
FIG. 5 is a diagram showing equivalent circuit modeling of a data storage device according to some embodiments of the inventive subject matter.

FIG. 5 is a diagram showing equivalent circuit modeling of a data storage device according to some embodiments of the inventive subject matter. For the sake of easy understanding, there are illustrated a plurality of nonvolatile memories 100 connected in common to a channel CH1, a memory controller 200, and a data input/output line 330.

Each of the remaining channels (e.g., CH2 through CHi) not shown may be connected to a plurality of nonvolatile memories.

Nonvolatile memories 100_1 through 100_n are stacked in the form of multi-stack chip. The nonvolatile memories 100_1 through 100_n are connected to the data input/output line 330 through pads 170_1 through 170_n, respectively. Capacitances C1 through Cn and resistances R1 through Rn included in the nonvolatile memories 100_1 through 100_n represent resistances and capacitances of data input/output switches 160 (refer to FIG. 4) and input/output circuits 150 (refer to FIG. 4). Although not shown in FIG. 5, inductance may be present. Some embodiments of the inventive subject matter are exemplified as the data input/output line 330 has resistance $R_0$, inductance L, and capacitance $C_0$.

The data input/output switches SW1 through SWn are controlled by a switch control signal SW_CTRL that is produced in response to a chip enable signal /CE. In some embodiments, the data input/output switches SW1 through SWn are controlled by a chip enable signal /CE that control logic 190 (refer to FIG. 4) receives. For example, if a nonvolatile memory is selected by the chip enable signal /CE, the chip enable signal /CE is bypassed to the data input/output switch 160 under the control of the control logic 190. A period where the data input/output switch 160 is turned on is substantially concurrent with a period where the chip enable signal /CE is activated. In some embodiments, a period where the data input/output switch 160 is turned on may be somewhat delayed compared with the period where the chip enable signal /CE is activated. If a nonvolatile memory is not selected, the data input/output switch 160 is turned off under the control of the control logic 190. A period where the data input/output switch 160 is turned off may be substantially concurrent with a period where the chip enable signal /CE is inactivated.

A data input/output switch 160 of an unselected nonvolatile memory is always not turned off, but it may be turned on or off such that a measured channel-capacitance value substantially equals a reference value. For example, when a measured channel-capacitance value exceeds a reference value, data input/output switches (of which the number is predetermined) may be turned off such that the measured channel-capacitance value substantially equals the reference value. When the measured channel-capacitance value is smaller than the reference value, data input/output switches of which the number is predetermined may be turned on such that the measured channel-capacitance value substantially equals the reference value.

A circuit for turning on or off a data input/output switch in response to a switch control signal SW_CTRL or a chip enable signal /CE will be more fully described with reference to FIGS. 6A through 6C.

In the event that data input/output switches SW1 through SWn are not implemented (i.e., corresponding to the event that data input/output switches are all turned on), measured capacitance of a data input/output line 330 includes all capacitances C1 through Cn regardless of whether a specific nonvolatile memory is selected or not and is expressed by the following:

$$Ctot=C0+C1+\ldots+Cn \tag{2}$$

With the nonvolatile memories 100_1 through 100_n connected in parallel to the data input/output line 330, a measured capacitance value of the data input/output line 330 may be markedly increased.

In some embodiments, the nonvolatile memories 100_1 through 100_n may include the data input/output switches SW1 through SWn, respectively. Assuming that one 100_1 of the nonvolatile memories 100_1 through 100_n is selected and remaining nonvolatile memories 100_2 through 100_n are not selected, a measured capacitance value of the data input/output line 330 is expressed by the following:

$$Ctot = C0 + C1 \tag{3}$$

Data input/output switches of unselected nonvolatile memories 100_2 through 100_n except the selected nonvolatile memory 100_1 are turned off, thereby reducing a measured capacitance value of the data input/output line 330. As described above, a data input/output switch of an unselected nonvolatile memory is always not turned off, but it is turned on or off such that a measured channel-capacitance value substantially equals a reference value.

As described above, data input/output switches of unselected nonvolatile memories are turned on or off such that a measured channel-capacitance value substantially equals a reference value, thereby improving signal integrity and reliability of a data storage device.

Figure 6A:
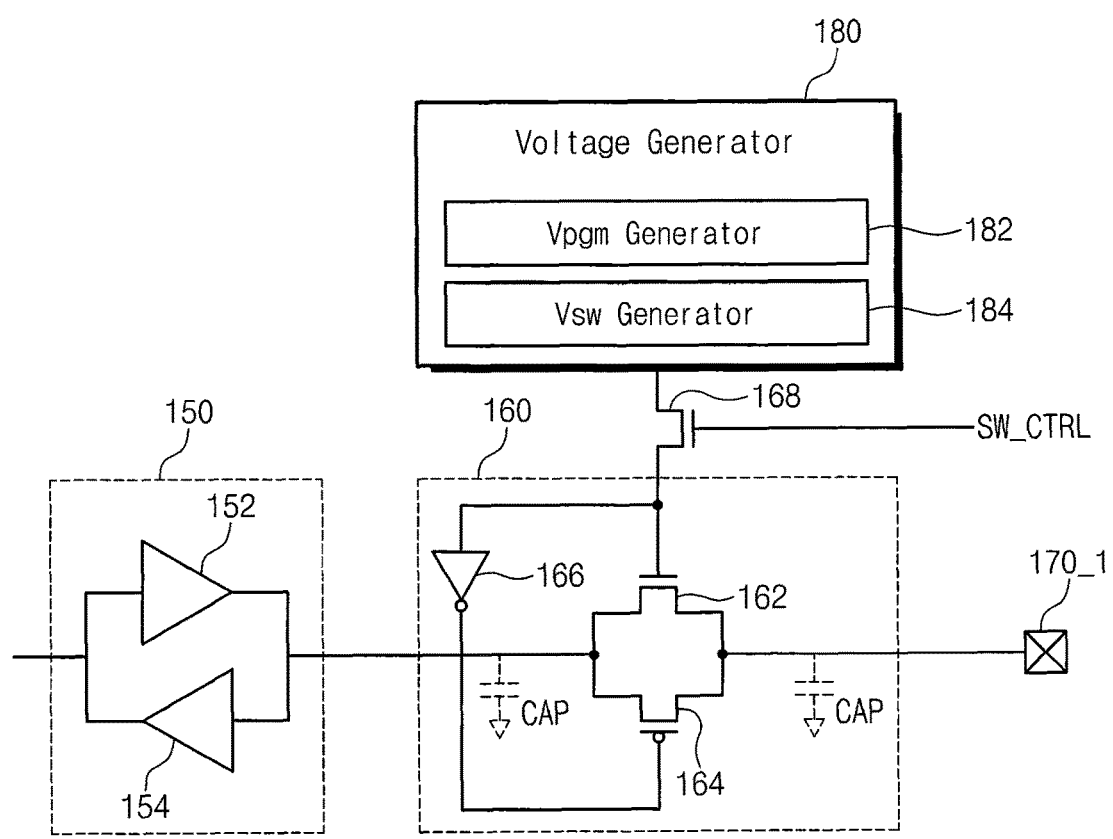
FIGS. 6A through 6C are diagrams showing a data input/output switch according to some embodiments of the inventive subject matter.
Figure 6B:
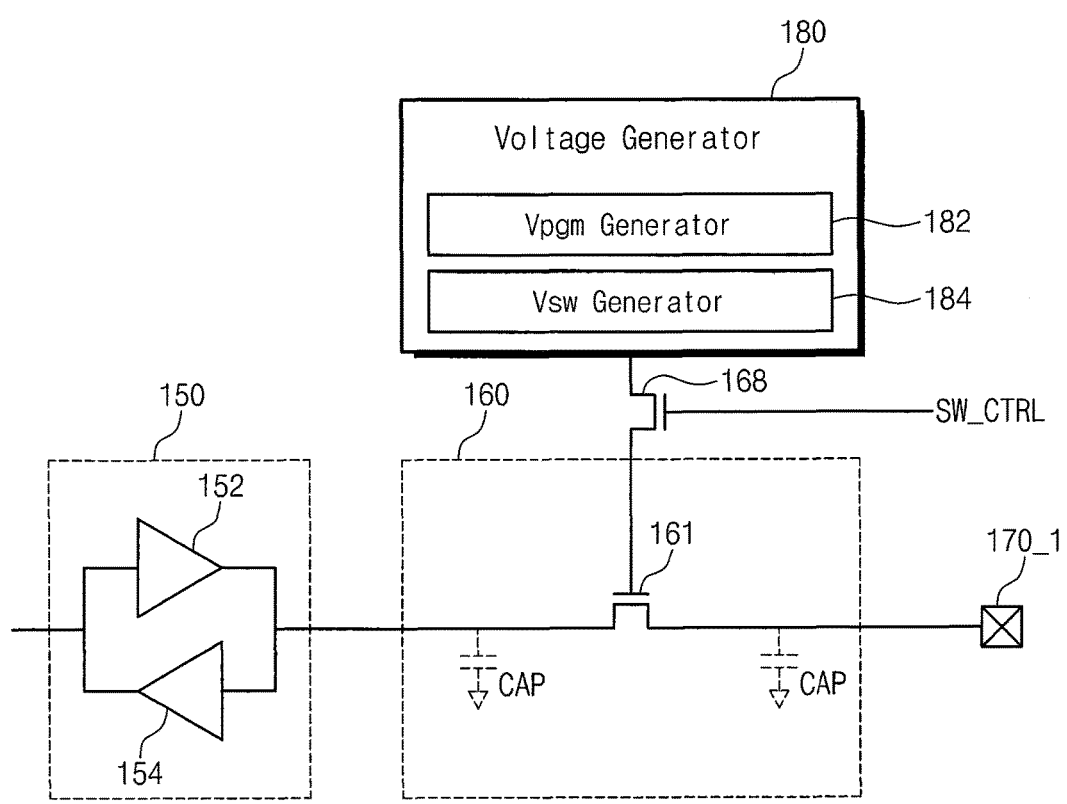
Figure 6C:
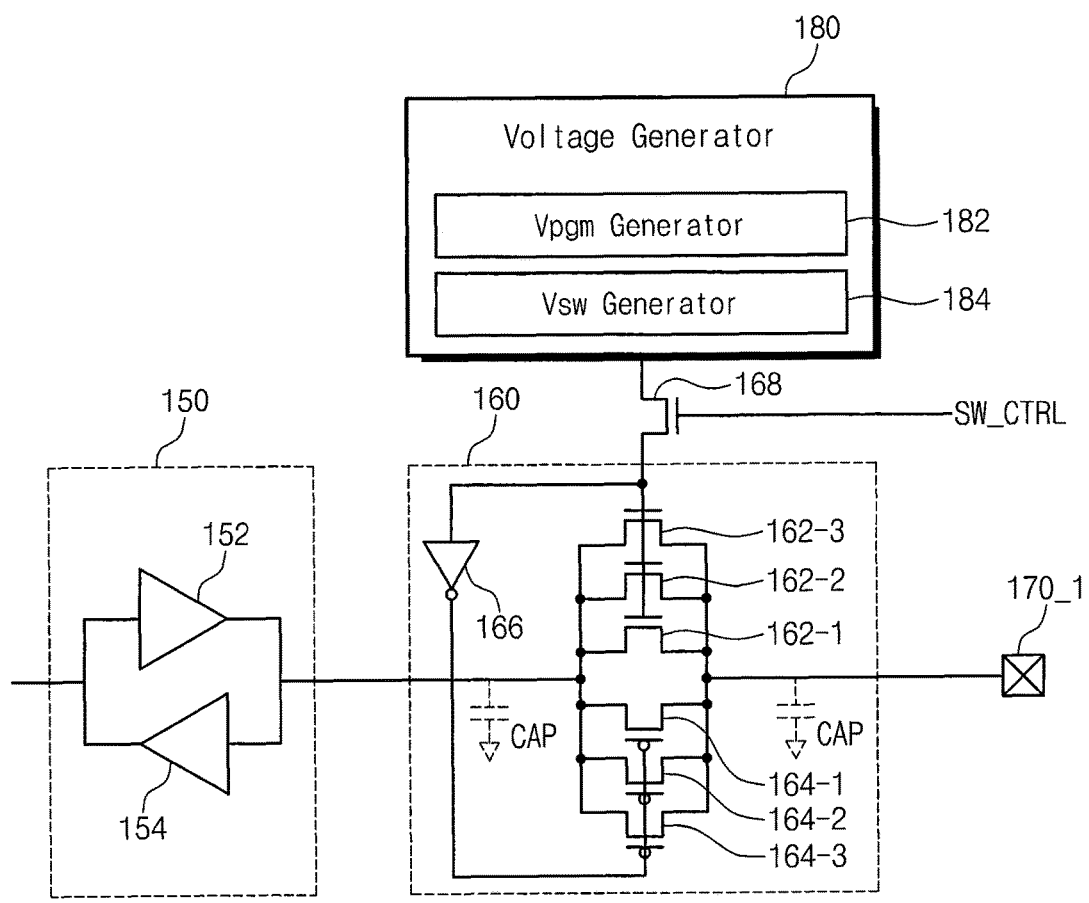

FIGS. 6A through 6C are diagrams showing a data input/output switch according to some embodiments of the inventive subject matter. Referring to FIG. 6A, a data input/output switch 160 is connected between an input/output circuit 150 and a pad 170_1. The input/output circuit 150 contains a driver 152 to drive data to be transmitted to a memory controller through the pad 170_1 and a receiver 154 to receive data provided from the memory controller through the pad 170_1. The data input/output switch 160 is turned on or off in response to a control of control logic 190 (refer to FIG. 4). For example, a transistor 168 that operates in response to a switch control signal SW_CTRL or a chip enable signal /CE is coupled between a voltage generator 180 and the data input/output switch 160. The control logic 190 may produce the switch control signal SW_CTRL in response to the chip enable signal /CE, for example. A delay may exist between an active period of the chip enable signal /CE and an active period of the switch control signal SW_CTRL. In some embodiments, under a control of the control logic 190, the chip enable signal /CE is provided to the transistor 168 while a nonvolatile memory is activated in response to the chip enable signal /CE. If the transistor 168 is turned on in response to the switch control signal SW_CTRL or the chip enable signal /CE, a program voltage Vpgm or a switching voltage Vsw may be applied to the data input/output switch 160.

The data input/output switch 160 has a transmission gate structure in which at least one NMOS transistor 162 and at least one PMOS transistor 164 are connected in parallel. An inverter 166 is placed between the NMOS transistor 162 and the PMOS transistor 164. Some embodiments of the inventive subject matter include the inverter 166 placed in a data input/output switch. However, the inventive subject matter is not limited thereto. For example, the inverter 166 may be external to a data input/output switch. The data input/output switch 160 is implemented with only one NMOS transistor as illustrated in FIG. 6B.

Implemented with at least one transistor, the data input/output switch 160 also has parasitic capacitance. Even though nonvolatile memories are not selected, the number of unselected nonvolatile memories of which the data input/output switches are turned on may be adjusted to substantially equal a reference capacitance value, thereby making it possible to overcome an increase in a capacitance value due to the data input/output switch 160.

Considering signal integrity, it is essential not only to adjust capacitance but to adjust a measured channel resistance value. The measured channel resistance value may be adjusted to have a reference value. For example, the reference value may be about 50Ω. However, the reference value may be changed in conformity with the rules.

Referring to FIGS. 5 and 6A through 6C, it is assumed that a nonvolatile memory 110_1 is selected and nonvolatile memories 100_2 through 100_n are not selected. A channel resistance value measured is expressed by the following equation (4) when the data input/output switches SW1 through SWn are implemented. When the data input/output switches SW1 through SWn are not implemented (i.e., corresponding to the event that all data input/output switches are turned on), a channel resistance value may be expressed as follows:

$$Rtot = R0 + R1 \tag{4}$$

$$Rtot = \frac{1}{\frac{1}{R1} + \frac{1}{R2} + \cdots + \frac{1}{Rn}} + R0 \tag{5}$$

As understood from equations (4) and (5), as more data input/output switches are implemented, a measured channel resistance value increases. The measured channel resistance value needs to be adjusted to substantially equal a reference value. This may be achieved by means of an On-Die Termination (OTD) circuit (not shown). A technique of adjusting a resistance value by means of the OTD circuit departs from the scope and sprit of the inventive subject matter, and a description thereof is thus omitted.

A self-resistance value of a data input/output switch may be adjusted by at least two different techniques described below with reference to FIGS. 6A through 6C.

A level of a voltage provided to a gate terminal of a transistor in a data input/output switch 160 may be adjusted. During a period where a transistor is not saturated, that is, an Id-to-Vg curve varies linearly, a resistance of the transistor decreases in proportion to an increase in a voltage applied to its gate terminal. Thus, the voltage generator 180 provides the increased voltage to the gate terminal of the NMOS transistor 162 of the data input/output switch 160. For example, the voltage applied to the gate terminal of the NMOS transistor 162 may be a voltage that a program voltage generator 182 generates. However, the inventive subject matter is not limited thereto. For example, the voltage applied to the gate terminal of the NMOS transistor 162 may be a voltage that a switching voltage generator 184 produces. In contrast, the voltage generator 180 may provide a decreased voltage to the gate terminal of the NMOS transistor 162 of the data input/output switch 160, thereby resulting in an increase in a self-resistance value of the data input/output switch 160.

The voltage applied to the gate terminal of the NMOS transistor 162 may be adjusted based on the degree of deterioration of transistors constituting the data input/output switch 160. For example, a level of the voltage applied to the gate terminal of the NMOS transistor 162 may decrease in proportion to an increase in the degree of deterioration of transistors. The level of deterioration of transistors included in the data input/output switch 160 may be determined, for example, based on measurement of a use time and/or a measurement of a number of program/erase cycles. For example, when the use time exceeds a reference time or the number of program/erase cycles exceeds a reference, a level of the voltage to be applied to the data input/output switch 160 may be decreased under the control of control logic 190 (refer to FIG. 4).

A self-resistance value of a data input/output switch may be adjusted by connecting transistors of the data input/output switch in parallel as illustrated in FIG. 6C.

Referring to FIG. 6C, gate terminals of NMOS transistors 162-1 through 162-3 are connected in common to the voltage generator 180, and gate terminals of PMOS transistors 164-1 through 164-3 are connected in common to an output of an inverter 166. Some embodiments of the inventive subject matter use three NMOS transistors and three PMOS transistors in the data input/output switch 160. However, the inventive subject matter is not limited thereto.

As the number of transistors connected in parallel increases, a self-resistance value of the data input/output switch 160 may decrease. If a resistance value of the data input/output switch 160 decreases, it may be possible to decrease a level of a voltage applied to gate terminals of the NMOS transistors 162-1 through 162-3 to turn on the data input/output switch 160. A resistance value of the data input/output switch 160 may be further decreased by increasing a level of the voltage applied to the gate terminals of the NMOS transistors 162-1 through 162-3.

Self-parasitic capacitance of the data input/output switch 160 may increase when the number of transistors connected in parallel increases. However, data input/output switches of unselected nonvolatile memories may be turned on or off such that a measured channel-capacitance value substantially equals a reference value, thereby making it possible to overcome influence of parasitic capacitance due to the data input/output switch 160. That is, trade-off may exist between resistance of the data input/output switch 160, decreased by connecting transistors of the data input/output switch 160 in parallel, and parasitic capacitance, increased by connecting transistors of the data input/output switch 160 in parallel.

In some embodiments, a channel resistance value measured may be adjusted by changing a level of a voltage to be applied to a data input/output switch, thereby improving signal integrity and making it possible for a data storage device to operate stably.

A channel resistance value measured may be adjusted not only by reducing a resistance value of a data input/output switch, but by reducing a resistance value of a driver 154 (refer to FIGS. 6A through 6C). This may make it relatively easy to adjust a channel resistance value so substantially equal a reference value (e.g., 50 ohms).

Figure 7:
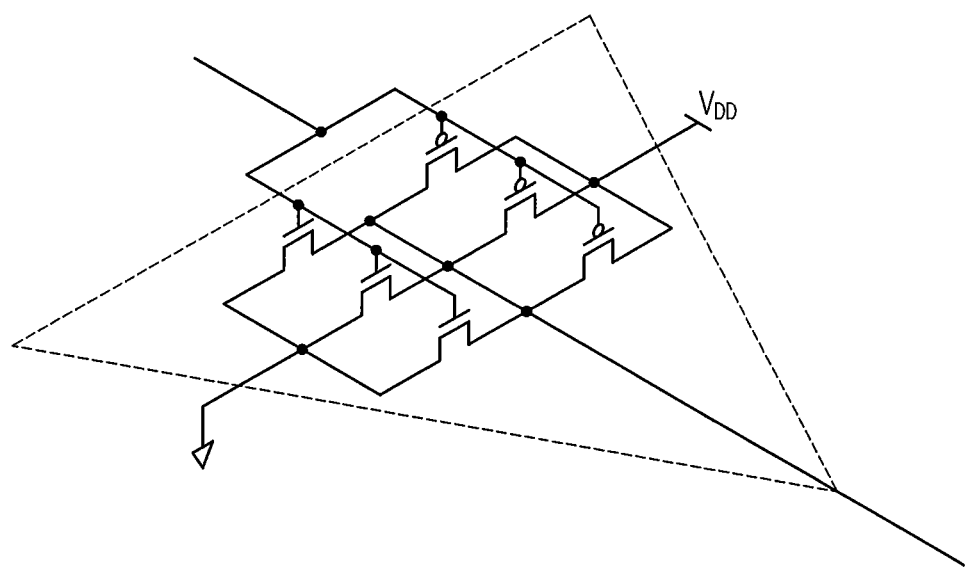
FIG. 7 is a diagram schematically illustrating a configuration of a driver according to some embodiments of the inventive subject matter.

FIG. 7 is a diagram schematically illustrating a configuration of a driver according to some embodiments of the inventive subject matter. Referring to FIG. 7, a driver 152 is implemented with a PMOS transistor and an NMOS transistor connected in series to each other, PMOS transistors connected in parallel to the PMOS transistor, and NMOS transistors connected in parallel to the NMOS transistor. In FIG. 7, three PMOS transistors are connected in parallel, and three NMOS transistors are connected in parallel. However, the inventive subject matter is not limited thereto. The number of transistors connected in parallel may differ in various embodiments.

When the number of transistors connected in parallel increases, a self-resistance value of the driver 152 decreases, while a self-capacitance value of the driver 152 increases. In some embodiments, when a plurality of nonvolatile memories are connected to the same channel, unselected nonvolatile memories (or, data input/output switches of the unselected nonvolatile memories) may be turned off such that a measured channel-capacitance value substantially equals a reference value, thereby making it possible to overcome influence of parasitic capacitance due to added transistors constituting the driver 152.

A trade-off may exist between resistance of the driver 152, decreased by connecting transistors of the driver 152 in parallel, and parasitic capacitance, increased by connecting transistors of the driver 152 in parallel.

In some embodiments, impedance (i.e., resistance and capacitance) measured at a channel may be adjusted when nonvolatile memories are connected to a memory controller through the same channel, thereby improving signal integrity and making stable operation of a data storage device possible.

Figure 8:
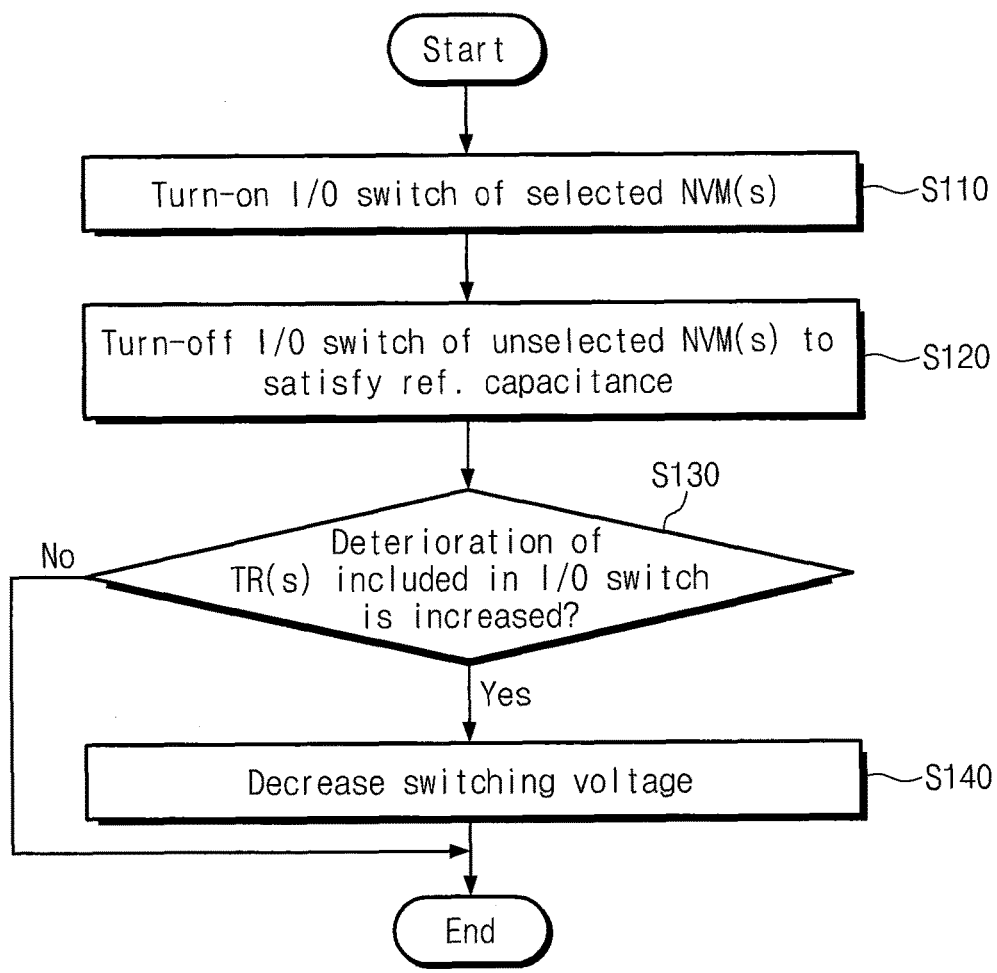
FIG. 8 is a flow chart showing an operating method of a data storage device according to some embodiments of the inventive subject matter.

FIG. 8 is a flow chart showing operations of a data storage device according to some embodiments of the inventive subject matter. A data storage device according to some embodiments of the inventive subject matter includes a plurality of nonvolatile memories connected to a memory controller through the same channel. An unselected nonvolatile memory may mean a nonvolatile memory that is not associated with a read or write operation or a copy-back operation, etc. A selected nonvolatile memory may mean a nonvolatile memory that is associated with a read or write operation or a copy-back operation, etc.

In step S110, a data input/output switch of the selected nonvolatile memory is turned on. A high voltage is applied to a gate of a transistor of the turned-on data input/output switch to reduce a self-resistance value of the turned-on data input/output switch. For example, the high voltage may be a program voltage used to program a nonvolatile memory. In some embodiments, a switching voltage generator 184 shown in FIG. 4 may produce a switching voltage that is used to turn on a data input/output switch of a selected nonvolatile memory.

In step S120, data input/output switches of unselected nonvolatile memories are turned off such that a measured channel-capacitance value substantially equals a reference capacitance value. Some embodiments of the inventive subject matter may include turning off a data input/output switch that is conducting after turning on another data input/output switch. However, turning on a data input/output switch and turning off another data input/output switch may be conducted at the same time. In some embodiments, turning on a data input/output switch may be conducted after turning off another data input/output switch.

In step S130, whether the level of deterioration of transistors constituting a data input/output switch increases is determined. If a high voltage is applied to reduce a resistance value of a data input/output switch under the condition that the level of deterioration of transistors constituting a data input/output switch increases, the data input/output switch may be broken down. The level of deterioration may be determined based on a measurement of a number of program/erase cycles, a measurement of a use time (e.g. a time when an end user uses a device) and the like. As a consequence of determining that the level of deterioration of transistors constituting a data input/output switch has increased, operations proceed to step S140. If it is determined that that the level of deterioration of transistors constituting a data input/output switch has not increased, operations may end.

In step S140, a switching voltage for turning on the data input/output switch is decreased. For example, when use time of the end user exceeds a reference time or the number of program/erase cycles exceeds a reference, a level of the switching voltage is decreased under a control of control logic 190 (refer to FIG. 4). The high voltage is applied to the data input/output switch of which the level of deterioration increases, thereby making it possible to prevent the data input/output switch from being broken down.

Figure 9:
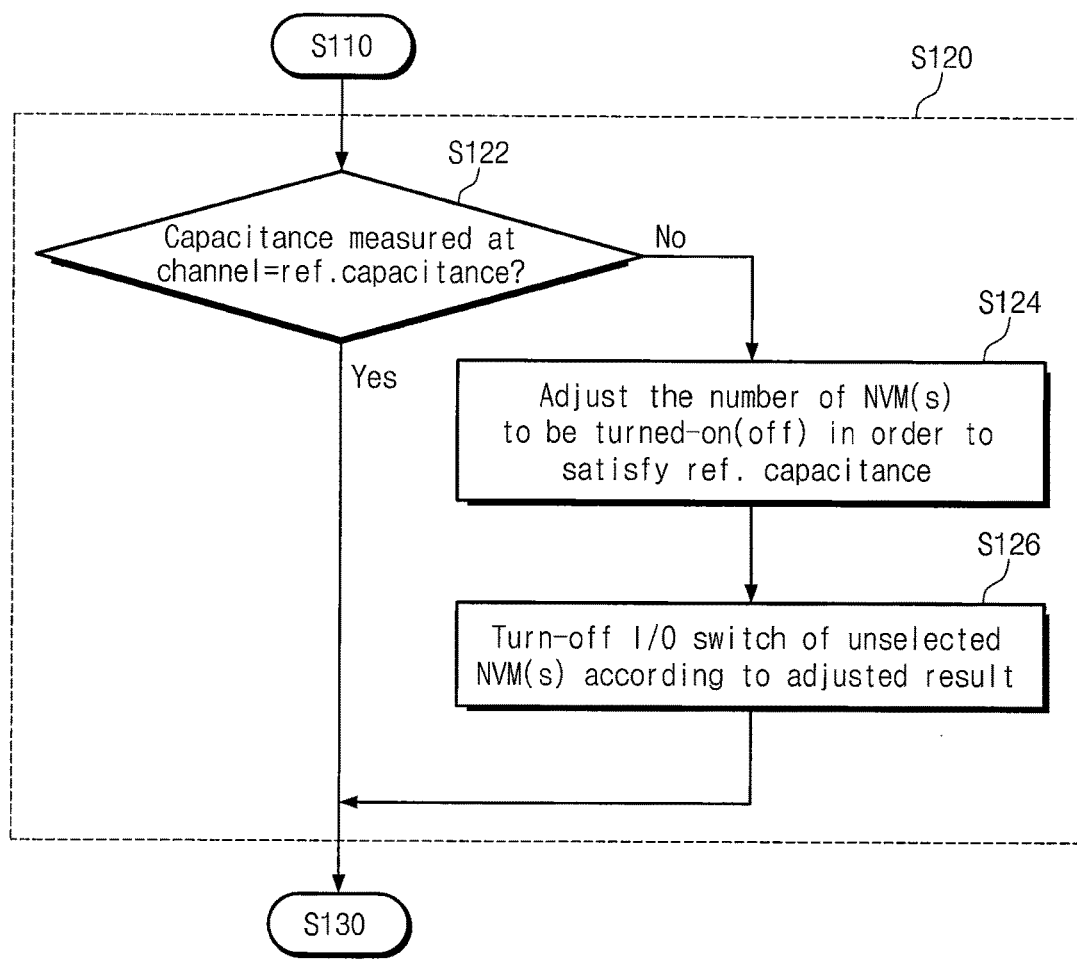
FIG. 9 is a detailed flow chart of step S120 shown in FIG. 8.

FIG. 9 is a detailed flow chart of step S120 shown in FIG. 8.

In step S122, whether a measured channel-capacitance value corresponds to a reference capacitance value is determined. That the measured channel-capacitance value corresponds to the reference capacitance value means that a reflection coefficient between a channel and nonvolatile memories is approximately '0', thereby improving signal integrity (refer to equation (1)). The measured channel-capacitance value must be adjusted to correspond to the reference capacitance value. The measured channel-capacitance value may be adjusted by changing a switching voltage of a data input/output switch or by means of an on-die termination (ODT) circuit. As a consequence of determining that the measured channel-capacitance value corresponds to the reference capacitance value, operations proceed to step S130. As a consequence of determining that the measured channel-capacitance value does not correspond to the reference capacitance value, operations proceed to step S124.

In step S124, the number of unselected nonvolatile memories to be turned on or off is adjusted such that the measured channel-capacitance value substantially equals the reference capacitance value. For example, if the measured channel-capacitance value exceeds the reference capacitance value, one or more data input/output switches of unselected nonvolatile memories may be turned off to reduce a capacitance.

In step S126, data input/output switches of at least some of the unselected nonvolatile memories are turned off. The number determined in step S125 may be used to decide the number of nonvolatile memories for which data input/output switches are turned off.

In some embodiments of the inventive subject matter, a data storage device includes a plurality of nonvolatile memories connected to a memory controller through the same channel, and data input/output switches of unselected nonvolatile memories are turned off or on such that a measured channel-capacitance value substantially equals a reference value, thereby making it possible to adjust the measured channel-capacitance value. A voltage to be applied to a data input/output switch is adjusted such that the measured channel-capacitance value substantially equals the reference value, thereby improving signal integrity and reliability of the data storage device.

The inventive subject matter is applicable, for example, to a solid state drive (SSD).

Figure 10:
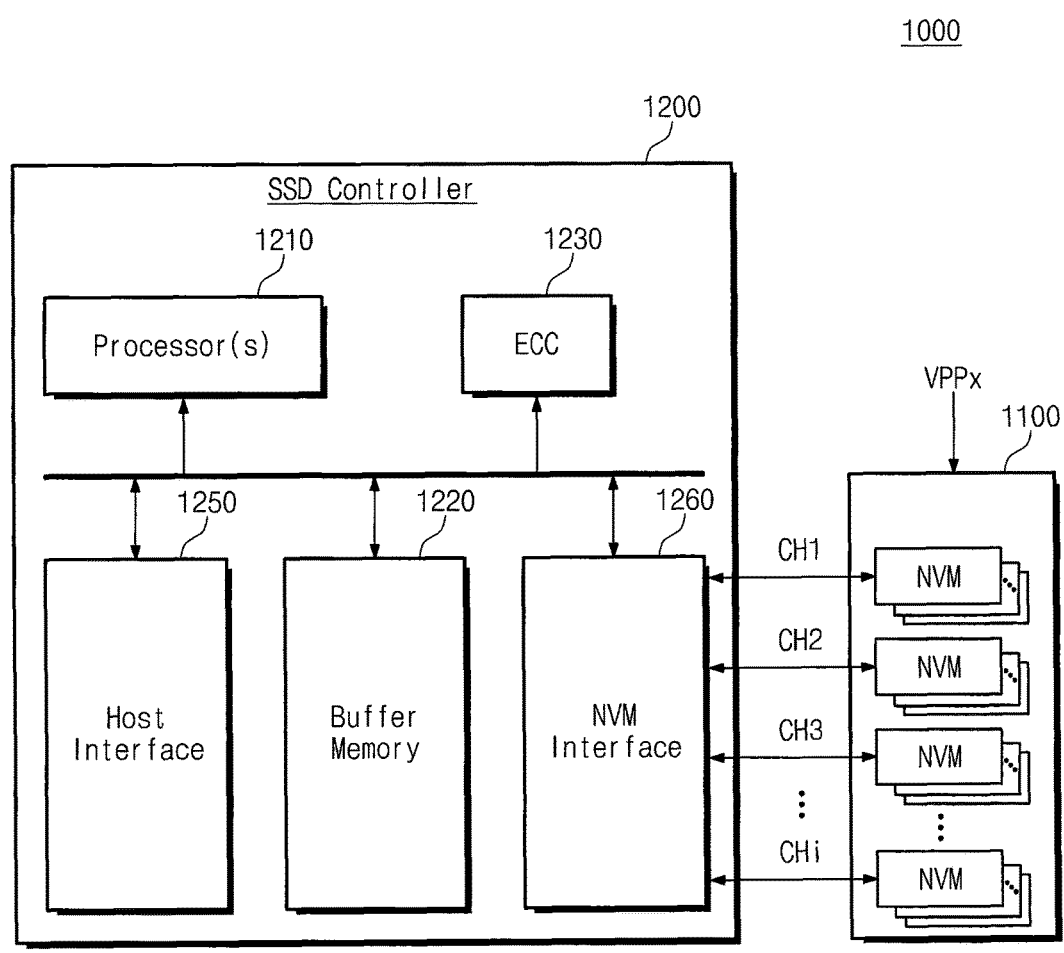
FIG. 10 is a block diagram schematically illustrating a solid state drive according to some embodiments of the inventive subject matter.

FIG. 10 is a block diagram schematically illustrating a solid state drive according to some embodiments of the inventive subject matter. Referring to FIG. 10, a solid state drive (hereinafter, referred to as SSD) 1000 includes a plurality of nonvolatile memory devices 1100 and an SSD controller 1200.

The nonvolatile memory devices 1100 may be optionally supplied with an external high voltage VPPx. The nonvolatile memory devices 1100 may be implemented with a nonvolatile memory described with reference to FIGS. 3 through 7. The SSD controller 1200 is connected to the nonvolatile memory devices 1100 through a plurality of channels CH1 to CHi (i being an integer of 2 or more). Nonvolatile memories connected to the memory controller 1200 via the same channel are implemented in the multi-stack chip form. The SSD controller 1200 includes one or more processors 1210, a buffer memory 1220, an ECC block 1230, a host interface 1250, and a nonvolatile memory interface 1260.

The buffer memory 1220 temporarily stores data needed to drive the SSD controller 1200. The buffer memory 1220 temporarily stores data to be programmed in the nonvolatile memories 1100 or data read therefrom.

The ECC block 1230 is configured to calculate an ECC value of data to be programmed at a write operation, correct an error of read data according to an ECC value at a read operation, and correct an error of data restored from the nonvolatile memory device 1100 at a data restoration operation. Although not shown in FIG. 10, a code memory may be further provided to store code data needed to drive the SSD controller 1200. The code memory may be implemented with a nonvolatile memory device.

The host interface 1250 provides an interface with an external device. The host interface 1250 may be a NAND flash interface. Besides, the host interface 1250 may be implemented with various interfaces or with a plurality of interfaces.

The nonvolatile memory interface 1260 provides an interface between the SSD controller 1200 and the nonvolatile memory devices 1100.

The SSD 1000 according to some embodiments of the inventive subject matter may reduce a measured channel-capacitance value, thereby improving signal integrity and reliability of the SSD 1000.

The inventive subject matter is also applicable to eMMC (an embedded multi-media card, moviNAND, and iNAND)

Figure 11:
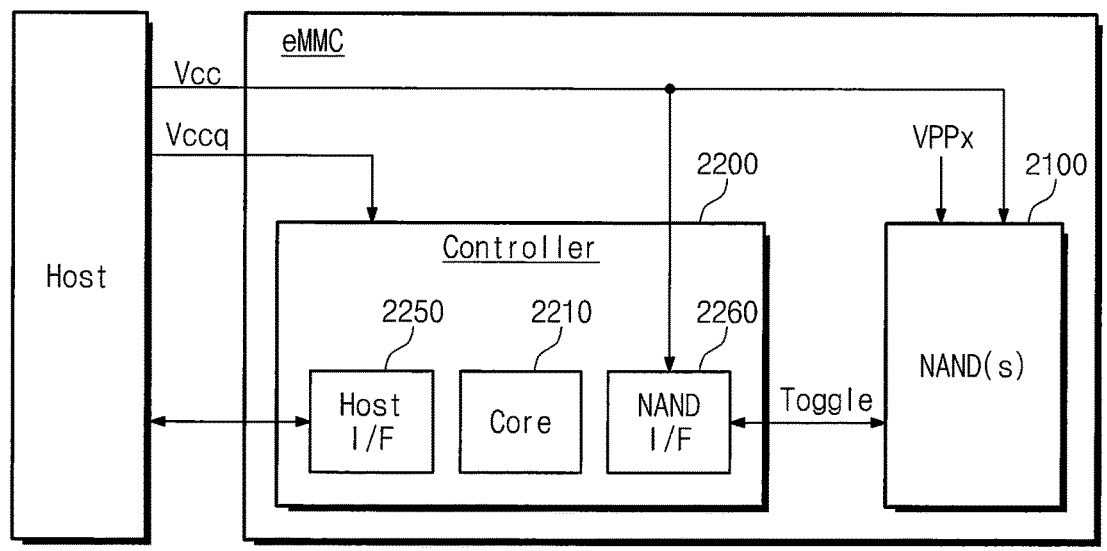
FIG. 11 is a block diagram schematically illustrating an eMMC according to some embodiments of the inventive subject matter.

FIG. 11 is a block diagram schematically illustrating an eMMC according to some embodiments of the inventive subject matter. Referring to FIG. 11, an eMMC 2000 includes one or more NAND flash memory devices 2100 and a controller 2200.

The NAND flash memory devices 2100 may be implemented with a nonvolatile memory device described with reference to FIGS. 3 through 7. The controller 2200 is connected to the NAND flash memory devices 2100 via a plurality of channels. The controller 2200 contains one or more controller cores 2210, a host interface 2250, and a NAND interface 2260.

The controller core 2210 may control an overall operation of the eMMC 2000. The host interface 2250 is configured to interface between the controller 2200 and a host. The NAND interface 2260 is configured to interface between the NAND flash memory device 2100 and the controller 2200. In some embodiments, the host interface 2250 may be a parallel interface (e.g., MMC interface). In other some embodiments, the host interface 2250 of the eMMC 2000 may be a serial interface (e.g., UHS-II, UFS interface, and so on). In some embodiments, the host interface 2250 of the eMMC 2000 may be a NAND interface.

The eMMC 2000 receives power supply voltages Vcc and Vccq from the host. Here, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In some embodiments, the eMMC 2000 may be optionally supplied with an external high voltage.

The eMMC 2000 according to some embodiments of the inventive subject matter may reduce a capacitance value measured at a channel connecting the NAND flash memory device 2100 and the memory controller 2200, thereby improving signal integrity and reliability of the eMMC.

The inventive subject matter is further applicable to a mobile device.

Figure 12:
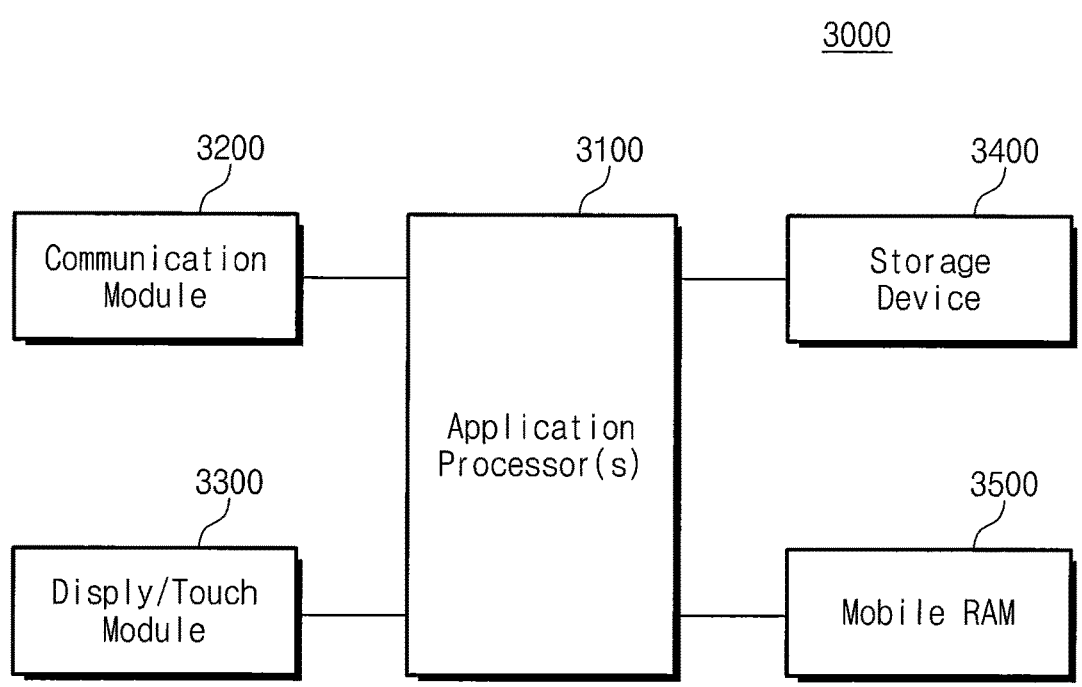
FIG. 12 is a block diagram schematically illustrating a mobile device according to some embodiments of the inventive subject matter.

FIG. 12 is a block diagram schematically illustrating a mobile device 3000 according to some embodiments of the inventive subject matter. Referring to FIG. 12, a mobile device 3000 includes an application processor 3100, a communication module 3200, a display/touch module 3300, a storage device 3400, and a mobile RAM 3500.

The application processor 3100 controls an overall operation of the mobile device 3000. The communication module 3200 is configured to perform wireless or wire communications with an external device. The display/touch module 3300 is configured to display data processed by the application processor 3100 or to receive data through a touch panel. The storage device 3400 is configured to store user data. The storage device 3400 may be, but not limited to, a memory card, an eMMC, an SSD, or an UFS device. The storage device 3400 is configured to have signal integrity as described with reference to FIGS. 3 through 7. The mobile RAM 3500 is configured to temporarily store data necessary when the mobile device 3000 operates.

While the inventive subject matter has been described with reference to some embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory comprising:
a memory cell array including a plurality of memory cells;
a pad configured to be connected to a data input/output line;
an input/output circuit configured to receive data to be programmed in the memory cell array and to transmit data read from the memory cell array;
a switch configured to couple and decouple the pad and the input/output circuit responsive to a switch control signal; and
a control circuit configured to generate the switch control signal responsive to a chip enable signal, the control circuit including a voltage generator configured to vary a magnitude of a switching voltage causing the switch to couple the pad to the input/output circuit.

2. The nonvolatile memory of claim 1, wherein the switch control signal is configured to close the switch when the chip enable signal indicates a selection of the nonvolatile memory and to open the switch when the chip enable signal indicates an unselection of the nonvolatile memory.

3. The nonvolatile memory of claim 2, wherein the voltage generator is configured to generate a program voltage for programming the memory cell array.

4. The nonvolatile memory of claim 3, wherein the switch comprises a transmission gate comprising at least one NMOS transistor and at least one PMOS transistor connected in parallel and driven by the switching voltage.

5. The nonvolatile memory of claim 3, wherein the input/output circuit comprises:
a driver connected to the switch and configured to drive data to be transmitted to the pad; and
a receiver connected to the switch and configured to receive data from the pad.

6. The nonvolatile memory of claim 5, wherein the driver comprises at least two NMOS transistors connected in parallel and coupled in series with at least two PMOS transistors connected in parallel.

7. The nonvolatile memory of claim 1, wherein the voltage generator is configured to vary the switching voltage responsive to a degree indicative of a potential deterioration of the switch.

8. The nonvolatile memory of claim 7, wherein the degree is based on a number of program/erase cycles.

9. A nonvolatile memory comprising:
a memory cell array including a plurality of memory cells;
a pad configured to be connected to a data input/output line;
an input/output circuit configured to receive data to be programmed in the memory cell array and to transmit data read from the memory cell array;
a switch configured to couple and decouple the pad and the input/output circuit responsive to a switch control signal; and
a control circuit configured to generate the switch control signal responsive to a chip enable signal and comprising a voltage generator configured to generate a program voltage for programming the memory cell array and a switching voltage for driving the switch,
wherein the switch control signal is configured to close the switch when the chip enable signal indicates a selection of the nonvolatile memory and to open the switch when the chip enable signal indicates an unselection of the nonvolatile memory and wherein the voltage generator is configured to vary the switching voltage based on a use measurement and/or a measurement of a number of program/erase cycles.

* * * * *